United States Patent
Bulzacchelli

(10) Patent No.: US 8,624,632 B2
(45) Date of Patent: Jan. 7, 2014

(54) SENSE AMPLIFIER-TYPE LATCH CIRCUITS WITH STATIC BIAS CURRENT FOR ENHANCED OPERATING FREQUENCY

(75) Inventor: John F. Bulzacchelli, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/434,321

(22) Filed: Mar. 29, 2012

(65) Prior Publication Data
US 2013/0257483 A1   Oct. 3, 2013

(51) Int. Cl.
- *H03K 3/356* (2006.01)
- *H03K 3/012* (2006.01)
- *G11C 7/06* (2006.01)

(52) U.S. Cl.
USPC ............... 327/57; 327/55; 327/96; 327/212; 327/219

(58) Field of Classification Search
None
See application file for complete search history.

(56) References Cited

U.S. PATENT DOCUMENTS

| | | | |
|---|---|---|---|
| 5,355,333 A | | 10/1994 | Pascucci |
| 5,508,644 A | * | 4/1996 | Branson et al. ............... 327/57 |
| 6,703,871 B2 | * | 3/2004 | You et al. ..................... 327/52 |
| 6,847,244 B2 | | 1/2005 | Pillay et al. |
| 6,867,716 B2 | | 3/2005 | Zhang |
| 7,233,172 B2 | * | 6/2007 | Kanamori et al. ............ 327/55 |
| 7,250,819 B2 | * | 7/2007 | Kelly et al. .................. 330/257 |
| 7,639,553 B2 | * | 12/2009 | Kim ............................. 365/194 |
| 2002/0130714 A1 | | 9/2002 | Riho et al. |
| 2003/0210078 A1 | | 11/2003 | Wijetunga et al. |
| 2005/0162193 A1 | * | 7/2005 | Payne et al. .................... 327/52 |
| 2007/0152736 A1 | | 7/2007 | Itoh et al. |
| 2007/0182458 A1 | | 8/2007 | Park et al. |
| 2007/0236258 A1 | | 10/2007 | Kiziloglu et al. |
| 2010/0165691 A1 | | 7/2010 | Watanabe et al. |
| 2010/0315858 A1 | | 12/2010 | Lynch |
| 2011/0115529 A1 | | 5/2011 | Jansson |
| 2011/0140741 A1 | | 6/2011 | Zerbe et al. |

OTHER PUBLICATIONS

J.F. Bulzacchelli et al., "A 78mW 11.1Gb/s 5-Tap DFE Receiver with Digitally Calibrated Current-Integrating Summers in 65 nm CMOS," IEEE ISSCC Dig. Tech. Papers, Feb. 2009, pp. 368-369.

S. Palermo et al., "A 90 nm CMOS 16 Gb/s Transceiver for Optical Interconnects," IEEE J. Solid-State Circuits, May 2008, pp. 1235-1246, vol. 43.

(Continued)

*Primary Examiner* — Lincoln Donovan
*Assistant Examiner* — Terry L Englund
(74) *Attorney, Agent, or Firm* — Anne V. Dougherty; Ryan, Mason & Lewis, LLP

(57) ABSTRACT

Sense amplifier-type latch circuits are provided which employ static bias currents for enhancing operating frequency. For example, a sense amplifier-type latch circuit includes a latch circuit that captures and stores data during an evaluation phase of the sense amplifier-type latch circuit, and outputs the stored data to differential output nodes. An input differential transistor pair has drains connected to the latch circuit and sources commonly connected to a coupled source node. A static bias current circuit is connected to the coupled source node to provide a static bias current which flows through the differential transistor pair and cross-coupled inverters of the latch during a precharge phase. A switch device, which is connected to the coupled source node, is turned off during the precharge phase and turned on during the evaluation phase by operation of a clock signal to increase current flow through the differential transistor pair.

10 Claims, 8 Drawing Sheets

(56) References Cited

OTHER PUBLICATIONS

D. Schinkel et al., "A Double-Tail Latch-Type Voltage Sense Amplifier With 18ps Setup+Hold Time", IEEE ISSCC Dig. Tech. Papers, Feb. 2007, pp. 314-315.

R. Payne et al., "A 6.25-Gb/s Binary Transceiver in 0.13-μM CMOS for Serial Data Transmission Across High Loss Legacy Backplane Channels," IEEE J. Solid-State Circuits, Dec. 2005, pp. 2646-2657, vol. 40.

* cited by examiner

10

40

SENSE AMPLIFIER-TYPE LATCH CIRCUITS WITH STATIC BIAS CURRENT FOR ENHANCED OPERATING FREQUENCY

TECHNICAL FIELD

The field relates generally to electronic latch circuits for use in digital and mixed-signal systems and, more specifically, to sense amplifier-type latch circuits that employ static bias current to enhance operating frequency.

BACKGROUND

A basic building block of many digital and mixed-signal systems is a regenerative latch circuit. A regenerative latch is a circuit that can receive a relatively weak input signal and regeneratively amplify the input signal to full-amplitude logic levels. The speed and sensitivity of this type of latch circuit are operating parameters that typically have a large influence on the performance of the overall system. For instance, when a latch is used as a decision-making circuit in a high-speed (e.g., multi-Gbit/s) serial link receiver, the maximum operating frequency of the latch may determine the highest data rate that can be supported by the receiver. If the pulses arriving at the receiver have been attenuated and distorted by high-frequency losses in the transmission media, a latch with high input sensitivity may be needed to recover the data bits with a low bit error rate (BER).

Another application in which a high-speed latch with good input sensitivity is needed is high-performance analog-to-digital conversion, in which the latch is used as a voltage comparator (1-bit quantizer). A fast comparator is needed in many analog-to-digital converter (ADC) architectures designed for high sampling rates (e.g., >1 G samples/second), and the sensitivity of the comparator should be high so that the ADC resolution is not degraded, usually characterized as the effective number of bits (ENOB).

SUMMARY

Exemplary embodiments of the invention generally include electronic latch circuits for use in digital and mixed-signal systems and, more specifically, sense amplifier-type latch circuits and methods to employ static bias currents within a sense amplifier-type latch framework for enhancing operating frequency of the latch.

In one exemplary embodiment of the invention, a sense amplifier-type latch circuit includes differential input nodes and differential output nodes, a latch circuit, a differential transistor pair, a static bias current circuit, and a switch device. The latch circuit comprises a first inverter and a second inverter, cross-couple connected to each other, wherein the latch circuit captures and stores data during an evaluation phase of the sense amplifier-type latch circuit, and outputs the stored data to the differential output nodes. The differential transistor pair includes gates connected to the differential input nodes of the sense amplifier-type latch circuit, drains connected to the latch circuit, and sources commonly connected to a coupled source node. The static bias current circuit is connected to the coupled source node of the differential transistor pair to provide a static bias current which flows through the differential transistor pair and the first and second inverters of the latch during a precharge phase. The switch device is connected to the coupled source node. The switch device is turned off during the precharge phase and turned on during the evaluation phase of the sense amplifier-type latch circuit by operation of a clock signal to increase current flow through the differential transistor pair.

In another exemplary embodiment of the invention, a sense amplifier-type latch circuit includes a first input node, a second input node, a first output node, a second output node, a first power supply node, and a second power supply node, and a differential amplifier stage comprising first and second output nodes. The sense amplifier-type latch circuit further includes a latch circuit connected between the first power supply node and the first and second output nodes of the differential amplifier stage, wherein the latch comprises first and second inverters, which are cross-coupled to each other, wherein an output of the first inverter is connected to the first output node of the sense amplifier-type latch circuit and to an input of the second inverter, and wherein an output of the second inverter is connected to the second output node of the sense amplifier-type latch circuit and to an input of the first inverter. The differential amplifier stage further includes a differential transistor pair having gates connected to the first and second input nodes of the sense amplifier-type latch circuit, and having a coupled source node. A switch device is connected between the coupled source node and the second power supply node, wherein the switch device is turned off during a precharge phase and turned on during an evaluation phase of the sense amplifier-type latch circuit by operation of a clock signal. A static bias current circuit is connected to the coupled source node of the differential transistor pair to provide a static bias current which flows through the differential amplifier stage and the first and second inverters of the latch during the precharge phase. The sense amplifier-type latch circuit further includes a reset circuit comprising a first reset switch connected between the first power supply node and the first output node of the sense amplifier-type latch circuit, and a second reset switch connected between the first power supply node and the second output node of the sense amplifier-type latch circuit. The first and second reset switches are responsive to the clock signal to switchably connect the first power supply voltage node to the first and second output nodes of the sense amplifier-type latch circuit during the precharge phase, and to switchably disconnect the first power supply voltage node from the first and second output nodes of the sense amplifier-type latch circuit during the evaluation phase.

These and other exemplary embodiments, aspects and features of the present invention will become apparent from the following detailed description of exemplary embodiments thereof, which is to be read in connection with the accompanying drawings.

DETAILED DESCRIPTION OF EXEMPLARY EMBODIMENTS

Figure 1:
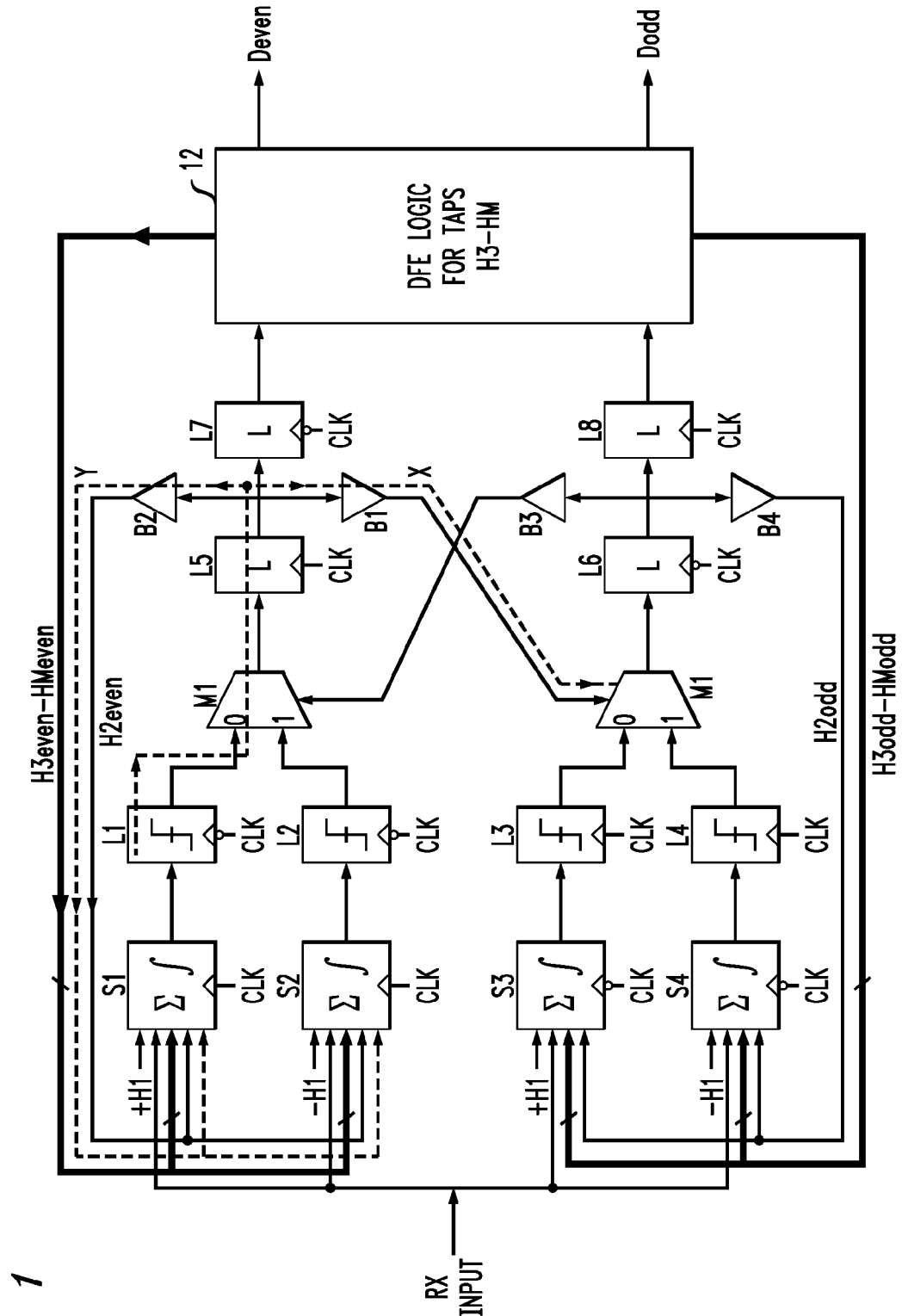
FIG. 1 is a block diagram of a half-rate M-tap DFE architecture employing first-tap speculation, to which principles of the invention can be applied.

Exemplary embodiments will now be discussed in further detail with regard to circuits and methods for employing static bias currents within sense amplifier-type latch circuits to enhance the operating frequency and improve performance of the latch circuits. Initially, various circuits to which principles of the invention may be applied will be discussed with reference to FIGS. 1 and 2.

Traditionally, latches with the highest operating frequencies are those based on current-mode logic (CML) topologies. However, the use of CML latches is not an attractive option in systems where high power efficiency is needed. First, a CML latch itself has high static power dissipation. Second, a CML latch generates an output signal which has limited swing (often less than half of the power supply voltage), and this output signal cannot be directly read by standard CMOS logic, which expects rail-to-rail input levels. While the output of a CML latch can be translated to rail-to-rail levels with circuits known as CML-to-CMOS converters, such circuits have significant propagation delays which often preclude their use in critical timing paths. Consequently, when a CML latch is used to launch data down a critical timing path, usually all of the logic stages in that path must also be realized in CML, with each stage adding significantly to the static power dissipation. In this case, the power overhead of using a CML latch is much higher than just its own static power dissipation.

This latter point is illustrated with a specific design example of a decision-feedback equalizer (DFE). Recent serial link receiver designs often include a DFE in order to compensate for the signal distortions which occur when fast digital pulses are transferred over electrical channels with limited bandwidth. A fundamental advantage of a DFE over a linear equalizer (such as a peaking amplifier) is that it is able to flatten the channel response (and reduce signal distortion) without amplifying noise or crosstalk. In a DFE, the previously decided bits are fed back with weighted tap coefficients and added to the received input signal. For an M-tap DFE, the feedback taps are denoted H1, H2, . . . , HM. The H1 tap represents the intersymbol interference (ISI) contributed by a data bit one unit interval (UI) earlier than the current bit being detected, the H2 tap represents the ISI contributed by a data bit two UIs earlier than the current bit, and so on. If the magnitudes and polarities of the tap weights are properly adjusted to match the channel characteristics, the ISI from the previous bits in the data stream will be cancelled, and the bits can be detected by the decision-making latch with a low BER.

The timing constraint associated with the H1 tap is the most difficult one to satisfy in a DFE, as there is only one UI available to make a data decision, to feed it back with appropriate weighting, and to add it to the received input signal. Even with the latest deep submicron CMOS technologies, this timing constraint becomes difficult to satisfy for data rates above 10 Gb/s. To relax this timing constraint, speculation is introduced. An example of a DFE with first-tap speculation is the half-rate M-tap architecture shown in FIG. 1.

FIG. 1 is a block diagram of a half-rate M-tap DFE architecture employing first-tap speculation, to which principles of the invention may be applied. In particular, FIG. 1 is a block diagram of a half-rate M-tap DFE circuit 10 having a known architecture which comprises a DFE logic block 12 that includes the feedback logic for generating weighted taps H3-HM, current integrating summing amplifiers (or summers) S1, S2, S3 and S4, decision making latch blocks L1, L2, L3 and L4, multiplexers M1 and M2, latches L5, L6, L7, and L8, and buffers B1, B2, B3 and B4. In the half-rate architecture of FIG. 1, even bits in the input signal (Rx input) are detected with the decision-making latches L1 and L2 on one (e.g., falling) edge of the clock signal CLK, and odd bits in the input signal (Rx input) are detected with decision-making latches L3 and L4 on the other (e.g., rising) edge of CLK.

The summing amplifiers (or summers) S1, S2, S3 and S4 add the DFE feedback taps H1-HM to the received input signal (Rx input). These summing amplifiers may be current-integrating type summing amplifiers, which improves power efficiency. With first-tap speculation, the H1 tap is not fed back to the summers S1, S2, S3, and S4 as a dynamic signal. Instead, both +H1 and −H1 are added to the received input signal as static offsets with a parallel pair of summers (e.g., summers S1 and S2 for the even bits, and summers S3 and S4 for the odd bits). Since the previous bit in the data stream has only two possible values (0 or 1), one of these parallel paths (in the even and odd DFE halves) represents the correct compensation of ISI, so the decision-making latch in that path can detect the data bit with a low BER. Later in time, once the previous bit is known and available, it is used to select a MUX (M1 in the case of the even DFE half, M2 in the case of the odd DFE half) so that the data bit detected with the correct value of ISI compensation is read out as the valid output of the DFE. In the architecture of FIG. 1, the rest of the DFE taps (H2 through HM) are fed back to the summers as dynamic signals (not speculated).

In the DFE architecture of FIG. 1, the most critical timing paths are those paths which select the MUXes (M1, M2) used for speculation and those paths which provide H2 feedback to the summers S1, S2, S3 and S4. The dashed lines in FIG. 1 denote the critical timing paths originating from the even DFE half (by symmetry, there are corresponding timing paths originating from the odd DFE half.) In one embodiment of the DFE, the decision-making latches L1-L4 can be implemented as CML-type decision-making latches. Since the delay of a CML-to-CMOS converter is not tolerable, each component in the critical timing paths must also be implemented in CML logic (including MUXes M1 and M2, latches L5 and L6, and buffers B1-B4), at a large cost in static power dissipation. The latches L7 and L8 can be sense amplifier-type latches which convert the CML signals to rail-to-rail levels so that the rest of the DFE logic 12 (for the later feedback taps) can be implemented with more power-efficient static CMOS circuits. Because the timing constraints for the later DFE taps are not as stringent as that for the H2 tap, the clock-to-Q delay of the sense amplifier-type latch can be tolerated here.

In principle, the power efficiency of a DFE with an architecture such as that shown in FIG. 1 could be greatly improved if the decision-making latches L1-L4 directly generated rail-to-rail output levels, as this would allow even the critical timing paths to be implemented in power-efficient domino and static CMOS circuit styles. A sense amplifier-type latch, also referred to as a differential cascode voltage switch (DCVS) latch, has excellent input sensitivity (at moderate clock rates) and provides a rail-to-rail output signal. Unfortunately, as explained in detail below, conventional sense amplifier-type latches have a relatively long turn-on time when entering their evaluation (regenerative) phase. This long turn-on time increases the clock-to-Q delay, which may be too large for the critical timing paths of a DFE, such as that shown in FIG. 1. The long turn-on time also prevents such latches from achieving good sensitivity at clock rates above 10 GHz, as a long turn-on time leaves insufficient time for regenerative amplification.

Figure 2:
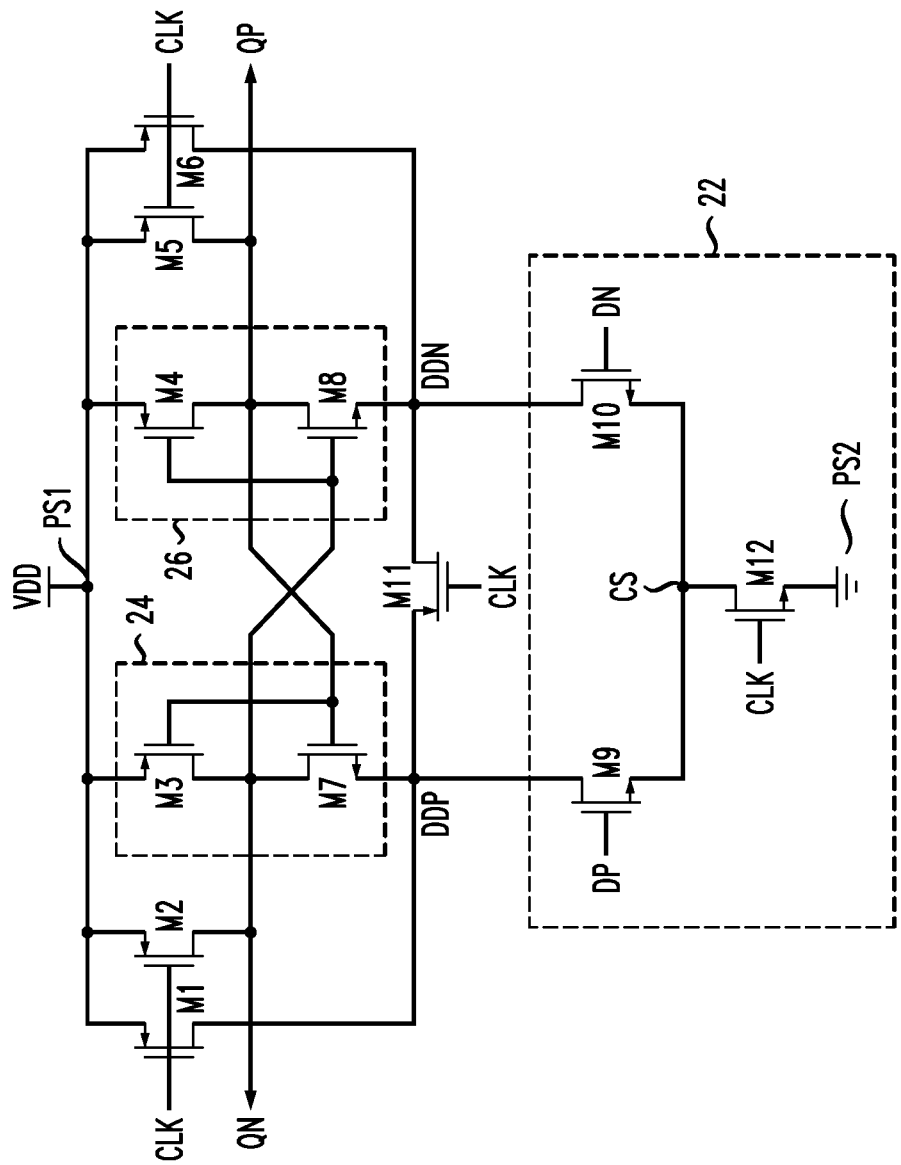
FIG. 2 is a schematic circuit diagram of a conventional sense amplifier-type latch circuit.

FIG. 2 is a schematic circuit diagram of a conventional sense amplifier-type latch circuit. As shown in FIG. 2, the sense amplifier-type latch circuit 20 generally comprises a plurality of MOS transistors M1, M2, M3, M4, M5, M6, M7, M8, M9, M10, M11 and M12. More specifically, the sense amplifier-type latch circuit 20 comprises a first input node DP, a second input node DN, a first output node QP, a second output node QN, a first power supply node PS1 (e.g., VDD), and a second power supply node PS2 (e.g., ground). The sense amplifier-type latch circuit 20 further comprises a differential amplifier stage 22 comprising first and second output nodes DDP and DDN, and a differential transistor pair M9 and M10 having gates connected to the first and second input nodes DP and DN (differential input), having drains connected to the first and second output nodes DDP and DDN of the differential amplifier stage 22, and having sources commonly connected to a coupled source node CS. The differential amplifier stage 22 further comprises an NMOS switch device M12 connected between the coupled source node CS and the second power supply node PS2. A clock signal CLK is applied to a gate terminal of the NMOS switch device M12.

The sense amplifier-type latch circuit 20 further comprises a latch circuit connected between the first power supply node PS1 and the first and second output nodes DDP and DDN of the differential amplifier stage 22. The latch circuit comprises a first inverter 24 and a second inverter 26, which are connected to each other in a cross-coupled configuration. In particular, the first inverter 24 comprises complementary PMOS and NMOS transistors M3 and M7, and the second inverter 26 comprises complementary PMOS and NMOS transistors M4 and M8. The output of the first inverter 24 is connected to the input of the second inverter 26 and the output node QN. The output of the second inverter 26 is connected to the input of the first inverter 24 and the output node QP. The latch circuit provides regenerative amplification and stores memory of a previous data decision, the function of which is well known in the art. The latch data is output as a differential output QP-QN.

The sense amplifier-type latch circuit 20 further comprises a reset circuit formed by a plurality of reset switches including PMOS switches M1, M2, M5, M6 and M11, which are driven by the clock signal CLK. The reset switches M1, M2, M5, M6 and M11, as well as the NMOS switch device M12, are switchably controlled by the clock signal CLK during a reset (or precharge) phase and an evaluation (decision-making) phase. More specifically, the sense amplifier-type latch circuit 20 operates as follows When the clock signal CLK transitions to logic low (e.g., 0 volts), the sense amplifier-type latch circuit 20 enters a precharge phase to precharge the nodes DDP, DDN, QP, and QN. In particular, during the precharge phase, in response to a logic low CLK signal, the NMOS switch device M12 is turned off, and the PMOS switches M1, M2, M5, M6, and M11 are turned on. As a result, the nodes DDP, DDN, QP, and QN are charged up to the power supply voltage VDD at node PS1. The precharging of these nodes eliminates memory of the previous data decision. While switches M1, M2, M5, and M6 pull the nodes DDP, DDN, QP, and QN up to the positive power supply voltage VDD, the switch M11 provides a differential short between nodes DDP and DDN, which equalizes their voltages and thereby helps minimize hysteresis.

In other embodiments of the sense amplifier-type latch of FIG. 2, some precharging switches are not used. For instance, some sense amplifier-type latches do not use switch M11, but at the expense of exhibiting a bit more hysteresis, depending on the clock frequency. Other sense amplifier-type latch designs omit switches M1 and M6. Since the lowest hysteresis and best sensitivity are obtained, however, when all of the internal nodes are precharged and differentially shorted (no high impedance or floating nodes), the embodiment shown in FIG. 2 is optimal among the conventional designs.

Further, when the clock signal CLK transitions to logic high (e.g., VDD volts), the sense amplifier-type latch circuit 20 enters an evaluation phase. In particular, during the evaluation phase, in response to a logic high CLK signal, the NMOS switch device M12 is turned on, and the PMOS switches M1, M2, M5, M6, and M11 are turned off. As such, the nodes DDP, DDN, QP, and QN are decoupled from the power supply voltage node PS1, and current begins to flow through the differential input pair M9/M10 causing the nodes DDP and DDN to discharge downward from the precharged voltage level (positive power supply voltage VDD). Depending on the polarity of the differential data input DP-DN, either node DDP or node DDN is discharged faster, which determines the binary value that is latched at the output nodes QP and QN once the cross-coupled first inverter 24 (M3/M7) and second inverter 26 (M4/M8) start to conduct with significant current and provide regenerative amplification.

While the sense amplifier-type latch 20 of FIG. 2 has good input sensitivity (at moderate clock rates) and is used in a wide variety of mixed-signal and digital circuits, the circuit 20 exhibits a relatively long turn-on time upon entering the evaluation phase due to the nodes DDP and DDN being charged up to VDD. The long turn on time increases its clock-to-Q delay and causes severe performance degradation when the frequency of CLK is raised above 10 GHz (even in the latest CMOS technologies). Indeed, a main problem is that nodes DDP and DDN, which are precharged to the positive power supply, must slew down a few hundred mV before the NMOS transistors (M7 and M8) of the cross-coupled inverters 24 and 26 begin to conduct with significant currents. The resulting turn-on time is too much overhead when the cycle time is very short. For instance, if the frequency of CLK is 12.5 GHz (with a 50% duty cycle), the evaluation phase is only 40 ps long. If the turn-on time exceeds 10 ps, for example, more than a quarter of the evaluation phase is wasted, and there is insufficient time left over for regenerative amplification. For this reason, the sense amplifier-type latch circuit 20 of FIG. 2 cannot provide high input sensitivity at such high clock frequencies. To improve the power efficiency of DFEs as well as other high-speed circuits (e.g., ADCs) using sense amplifier-type latch circuits, it is desirable to have a latch circuit that can generate rail-to-rail output signals with reduced latency, as compared to the conventional sense amplifier-type latch of FIG. 2.

Figure 3:
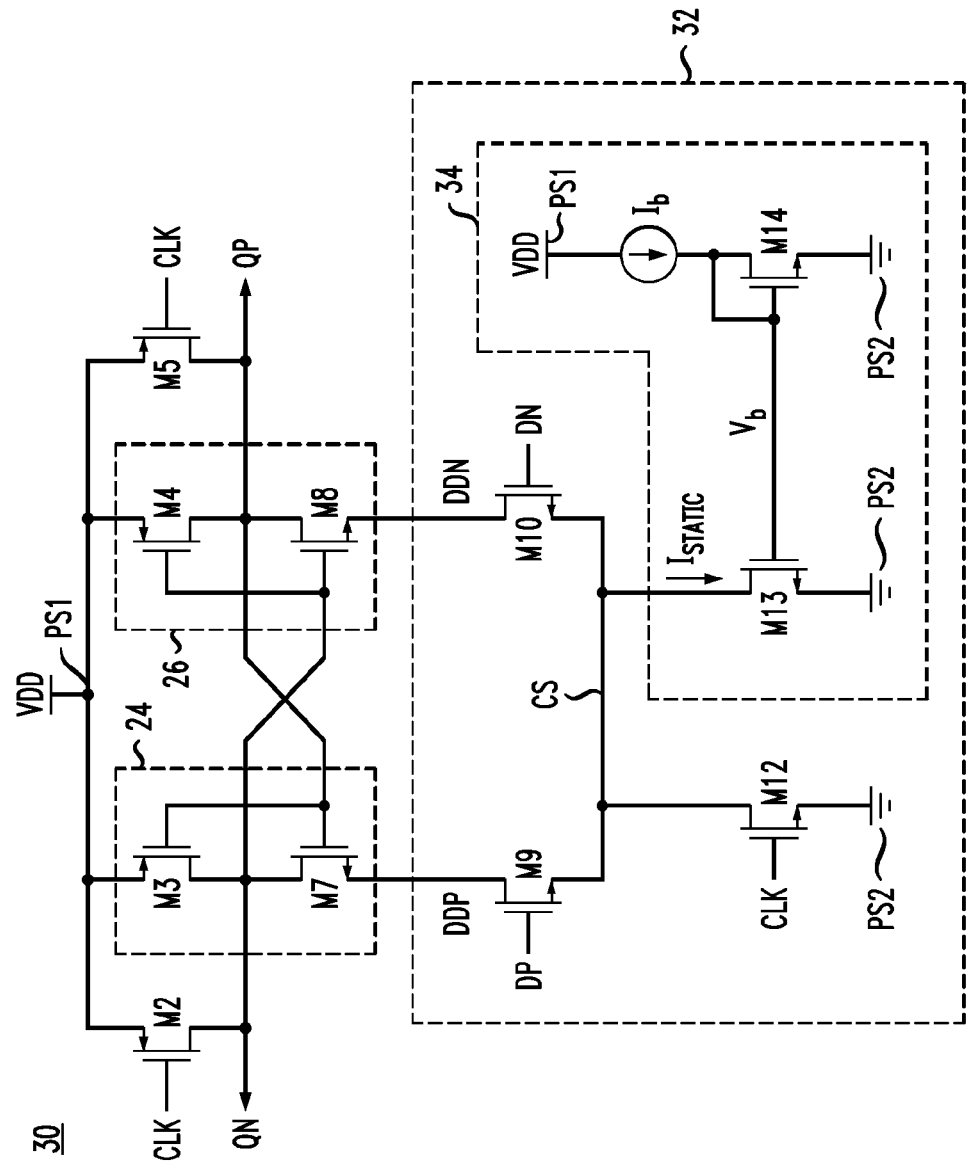
FIG. 3 is a schematic circuit diagram of a sense amplifier-type latch circuit according to an exemplary embodiment of the invention.

FIG. 3 is a schematic circuit diagram of a sense amplifier-type latch circuit 30 according to an exemplary embodiment of the invention, in which faster turn-on time and enhanced operating frequency are realized by biasing key transistors with static currents during the precharge phase. As generally shown in FIG. 3, the sense amplifier-type latch circuit 30 generally comprises a plurality of MOS transistors M2, M3, M4, M5, M7, M8, M9, M10, M12, M13 and M14. More specifically, the sense amplifier-type latch circuit 30 comprises a first input node DP, a second input node DN, a first output node QP, a second output node QN, a first power supply node PS1 (e.g., VDD), and a second power supply node PS2 (e.g., ground). The sense amplifier-type latch circuit 30 further comprises a differential amplifier stage 32 comprising first and second output nodes DDP and DDN, and a differential transistor pair M9 and M10 having gates connected to the first and second input nodes DP and DN (differential input), having drains connected to the first and second output nodes DDP and DDN, and having sources commonly connected to a coupled source node CS. The differential amplifier stage 32 further comprises an NMOS switch device M12 connected between the coupled source node CS and the second power supply node PS2. A clock signal CLK is applied to a gate terminal of the NMOS switch device M12.

The sense amplifier-type latch circuit 30 further comprises a latch circuit connected between the first power supply node PS1 and the first and second output nodes DDP and DDN of the differential amplifier stage 32. Similar to the latch in the sense amplifier-type latch circuit 20 of FIG. 2, the latch circuit shown in FIG. 3 comprises a first inverter 24 and a second inverter 26, which are connected to each other in a cross-coupled configuration, wherein the output of the first inverter 24 is connected to the input of the second inverter 26 and the output node QN, and wherein the output of the second inverter 26 is connected to the input of the first inverter 24 and the output node QP.

The sense amplifier-type latch circuit 30 further comprises a reset circuit formed by a plurality of reset switches including PMOS switches M2 and M5, which are driven by the clock signal CLK. In contrast to the circuit of FIG. 2, the reset circuit in FIG. 3 does not include the reset switches M1, M6 and M11. The reset switches M2 and M5, and the NMOS switch device M12 are switchably controlled by the clock signal CLK during a reset (or precharge) phase and an evaluation (decision-making) phase.

The sense amplifier-type latch circuit 30 differs from that of FIG. 2 in that the circuit 30 of FIG. 3 does not include the reset switches M1 and M6 (as shown in FIG. 2) to precharge the nodes DDP and DDN to the power supply voltage VDD. Instead, the differential amplifier stage 32 as shown in FIG. 3 further comprises a static bias current circuit 34 connected to the coupled source node CS of the differential transistor pair M9/M10 to provide a static bias current which flows through the differential amplifier stage and the first and second inverters 24 and 26 of the latch during the precharge phase.

More specifically, the static bias current circuit 34 applies a static bias current $I_{static}$ to the differential input transistor pair M9/M10 and latch circuit during the precharge phase so that nodes DDP and DDN are not floating, but rather settle to a certain voltage level (approximately a gate-to-source voltage below VDD). Because this voltage level is less than VDD (as compared to FIG. 2), the turn-on time at the beginning of the evaluation phase is decreased, as explained in further detail below. The static bias current circuit 34 includes NMOS transistors M13 and M14 connected as a current mirror and a current source $I_b$. In particular, in the example shown in FIG. 3, a gate voltage $V_b$ of transistor M13 is generated by driving a bias current $I_b$ through the diode-connected transistor M14, to generate a simple current mirror relationship between $I_b$ and $I_{static}$. Other arrangements for biasing a tail device to produce a static current can be employed in the circuit 34 without departing from the spirit and scope of the present invention. The sense amplifier-type latch circuit 30 operates as follows.

When the clock signal CLK transitions to logic low (e.g., 0 volts), the sense amplifier-type latch circuit 30 enters the precharge phase to precharge the nodes QP and QN. In particular, during the precharge phase, in response to a logic low CLK signal, the NMOS switch device M12 is turned off, and the PMOS switches M2 and M5 are turned on. As a result, the nodes QP and QN are charged up to the power supply voltage VDD. The precharging of these nodes eliminates memory of the previous data decision. During the precharge phase, while the NMOS switch device M12 is turned off, the tail current device M13 remains connected to the common-source node of the input differential pair M9/M10 and is biased to act as a current source with value $I_{static}$. The value of $I_{static}$ is preferably selected to have a modest value (e.g., 200 microamperes) so that the power penalty of using it is fairly low. For instance, the static power dissipation due to $I_{static}$ may be lower than the dynamic power dissipation of the latch when clocked at a high frequency such as 10 GHz. Due to the static current $I_{static}$ that is sunk by tail current transistor M13, a modest value of bias current flows through the differential input stage M9/M10 during the precharge phase. As a result, the NMOS transistors M9 and M10 are biased close to the edge of strong conduction (with gate-to-source voltages at least close to their threshold voltages).

Moreover, the NMOS transistors M7 and M8 of the cross-coupled inverters 24 and 26 connected to the drains of transistors M9 and M10 at nodes DDP and DDN, respectively, are also biased close to the edge of strong conduction during the precharge phase of the latch 30. Although the nodes DDP and DDN are not precharged to VDD using PMOS switches (M1 and M6 as in FIG. 2), the nodes DDP and DDN are not floating (high impedance) during the precharge phase. The static currents flowing through the drains of the transistors M9 and M10 pull the voltages at nodes DDP and DDN down to a level which allows the static currents to also flow through transistors M7 and M8. Since the gates and drains of the NMOS transistors M7 and M8 are precharged to the positive power supply voltage VDD during the precharge phase, the voltages at nodes DDP and DDN settle to a level which is approximately VDD-Vgs (the gate-to-source voltage of the transistors M7 and M8, respectively).

Furthermore, since the NMOS transistors M7 and M8 are effectively diode-connected transistors that are biased with currents set by $I_{static}$, the impedance at nodes DDP and DDN during the precharge phase is approximately 1/gm, where gm is the transconductance of transistor M7 (or M8). With a modest (but not very small) value of $I_{static}$, this impedance is low enough that the voltages at nodes DDP and DDN settle quickly in the precharge phase, which helps reduce latch hysteresis. As in the sense amplifier-type latch 20 of FIG. 2, the nodes DDP and DDN are neither floating nor high-impedance nodes during the precharge phase. Since the static currents flowing through the drains of transistors M7 and M8 do flow through the precharging switches M2 and M5, these switches must be sized for low on-resistance so that nodes QN and QP are pulled up to the positive power supply with negligible IR drops. In practice, the use of static currents does not entail a real penalty in the sizing of switch transistors M2 and M5, as these switches need to be just as large or larger to meet their dynamic requirements (i.e., fast precharging of parasitic capacitances when cycle times are short).

Further, when the clock signal CLK transitions to logic high (e.g., VDD volts), the sense amplifier-type latch circuit 30 enters the evaluation phase. In particular, during the evaluation phase, in response to a logic high CLK signal, the NMOS switch device M12 is turned on, and the PMOS switches M2 and M5 are turned off. As such, the nodes QP and QN are decoupled from the power supply voltage node. Since the current that flows through the NMOS switch device M12 (when "ON") is much higher than the static current $I_{static}$ that flows through the tail current transistor M13, the total current flowing through the differential input amplifier stage 32 greatly increases. Because the NMOS transistors M9 and M10 of the differential input amplifier stage 32 and the NMOS transistors M7 and M8 of the cross-coupled inverters 24 and 26 are biased close to the edge of strong conduction during the precharge phase, the nodes DDP and DDN do not have to slew far before substantial currents flow through the cross-coupled inverters, and the process of regeneration begins.

For example, assuming VDD is 1 Volt, and the threshold voltage $V_{TH}$ of transistors M7 and M8 is in a range of 300 mV to 400 mV, the static bias current $I_{static}$ can be selected so that the voltages at nodes DDP and DDN are set to a level in a range of 600 mV to 700 mV during the precharge phase, and the transistors M7 and M8 are biased in a state close to strong conduction. Consequently, when the latch circuit 30 enters the evaluation phase, there is little time wasted for turn-on at the beginning of the evaluation phase. The large reduction of the turn-on time (i.e., acceleration of the regeneration) reduces the clock-to-Q delay of the latch and improves its sensitivity at high clock frequencies (short cycle times). Again, to reiterate, this is in contrast to the latch circuit 20 of FIG. 2 wherein the nodes DDP and DDN are precharged to VDD, which takes a longer time to discharge to a level of VDD-Vgs, thereby delaying the regeneration process and increasing the latency.

Figure 4:
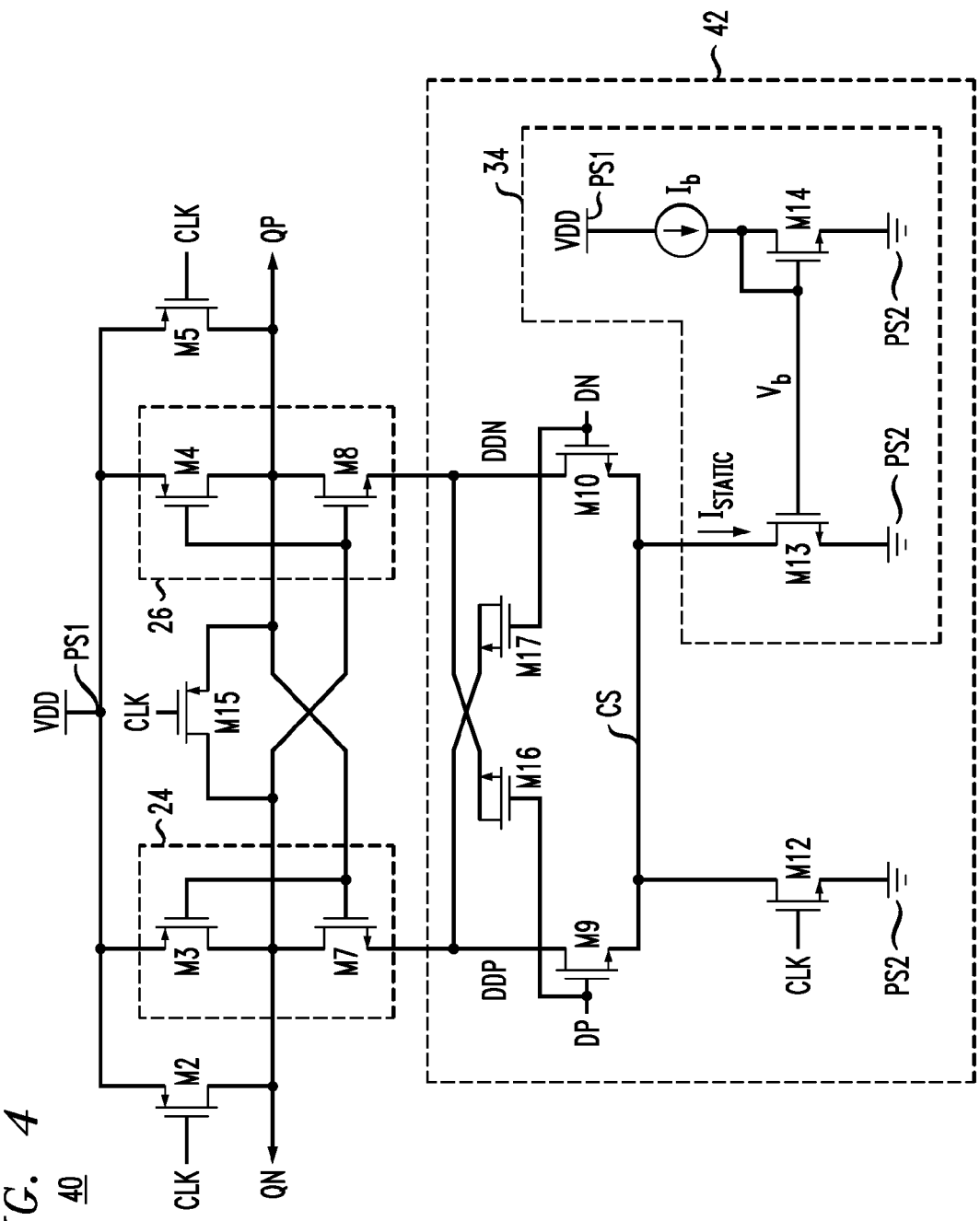
FIG. 4 is a schematic circuit diagram of a sense amplifier-type latch circuit according to another exemplary embodiment of the invention.

FIG. 4 is a schematic circuit diagram of a sense amplifier-type latch circuit 40 according to another exemplary embodiment of the invention. As generally shown in FIG. 4, the sense amplifier-type latch circuit 40 comprises a plurality of MOS transistors M2, M3, M4, M5, M7, M8, M9, M10, M12, M13, M14, M15, M16 and M17. The sense amplifier-type latch circuit 40 is similar to the circuit 30 of FIG. 3 in that it includes a differential amplifier stage 42 which comprises a differential transistor pair M9 and M10, an NMOS switch device M12 connected between the coupled source node of M9/M10 and the second power supply node PS2 (e.g., ground), and a static current bias circuit 34, a latch circuit formed by a first inverter 24 (M3/M7) and a second inverter 26 (M4/M8), connected in a cross-coupled configuration to form a latch, and a reset circuit formed by reset switches M2 and M5. The reset switches M2 and M5 and the NMOS switch device M12 are switchably controlled by the clock signal CLK during a reset (or precharge) phase and an evaluation (or decision-making) phase.

The sense amplifier-type latch circuit 40 further includes a reset transistor M15 connected between the output nodes QN and QP which serves as a differential reset device that shorts the output nodes QN and QP during a reset phase. Indeed, in response to a logic low signal of CLK during a precharge phase, the reset switch M15 is turned on to short the output nodes QN and QP together to eliminate any residual differential voltage QP-QN that may exist before the evaluation phase. Such elimination of the differential voltage helps reduce latch hysteresis. The reset switch M15 is turned off during the evaluation phase. While not shown in FIG. 4, other differential reset devices may be added to the sense amplifier-type latch circuit of the present invention. For instance, a reset transistor connected between nodes DDP and DDN can be implemented to help further reduce latch hysteresis in some applications.

Moreover, the input differential amplifier stage 42 further includes a neutralization circuit formed by transistors M16 and M17. In FIG. 4, the transistors M16 and M17 are configured as capacitors wherein the drain and source nodes of transistor M16 are connected to each other, and wherein the drain and source nodes of transistor M17 are connected to each other. In this configuration, the transistor M16 operates as a capacitor that is connected between the input node DP and the node DDN, and the transistor M17 operates as a capacitor that is connected between the input node DN and the node DDP, which serves to neutralize (i.e., cancel) the differential kickback from nodes DDP and DDN to the input nodes DP and DN due to the gate-to-drain capacitances of transistors M9 and M10.

More specifically, in the absence of the neutralization transistors M16 and M17, during operation of the circuit, there can be some capacitive coupling (kickback) between nodes DDP and DP due to the gate-to-drain capacitance of transistor M9, and between nodes DDN and DN due to the gate-to-drain capacitance of transistor M10, which causes undesired disturbances on the voltages at input nodes DP and DN, as the voltages at nodes DDP and DDN rise and fall during operation. To neutralize this effect differentially, the transistors M16 and M17 are configured and sized to act like capacitors with capacitances that match the gate-to-drain capacitances of transistors M9 and M10. It should be noted that other types of capacitors (including other transistor arrangements) may be used in place of transistors M16 and M17—the only requirement is that the capacitance values match the gate-to-drain capacitances of transistors M9 and M10. In the configuration shown in FIG. 4, the transistors M16 and M17 do not conduct DC current (as the source of M16 is shorted to its own drain, and the source of M17 is shorted to its own drain). Instead, they are connected as cross-coupled capacitors that neutralize (cancel differentially) the capacitive coupling effects due to the gate-to-drain capacitances of transistors M9 and M10.

For example, consider a case where the differential voltage DDP-DDN rises, with the voltage on the DDP node increasing and the voltage on the DDN node decreasing. As the voltage on the DDP node increases, it would naturally couple capacitively back to the DP node and raise the voltage of node DP (positive disturbance). As the voltage on the DDN node decreases, it would naturally couple capacitively back to the DN node and lower the voltage of DN (negative disturbance). By connecting the node DDN (with decreasing voltage in this case) to the node DP via a capacitive element (e.g., M16), a negative disturbance is introduced at node DP which cancels the positive disturbance due to the coupling through the gate-to-drain capacitance of M9. Likewise, by connecting the node DDP (with increasing voltage in this case) to the node DN via a capacitive element (e.g., M17), a positive disturbance is introduced at node DN which cancels the negative disturbance due to the coupling through the gate-to-drain capacitance of M10. In this way, differential kickback from nodes DDP and DDN to nodes DP and DN is eliminated.

Since sense amplifier-type latch circuits employ a precharge phase, there is a time interval during which both of its outputs (nodes QP and QN in FIGS. 2, 3 and 4) are precharged to the same precharge level, wherein the differential output signal QP-QN does not represent a valid logic bit (neither the previously decided nor a current logic bit). In many mixed-signal and digital systems in which a sense amplifier-type latch is used, it is desirable that the previously decided bit be available for reading while the sense amplifier-type latch is in its precharge phase. In order to hold the previously decided bit as a valid output during the precharge phase, a keeper circuit may be connected to the outputs of a sense amplifier-type latch.

Figure 5:
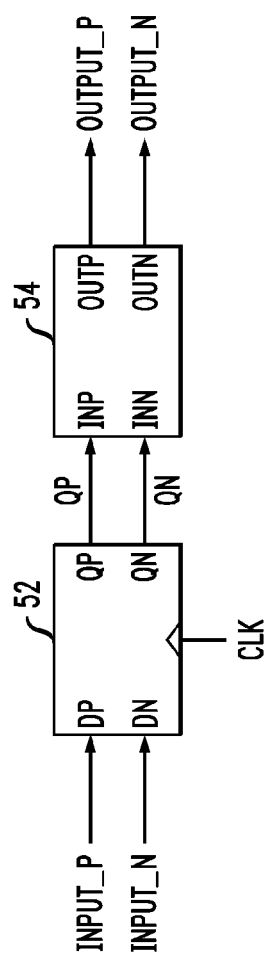
FIG. 5 is a block diagram of a circuit comprising a sense amplifier-type latch and a keeper circuit.

FIG. 5 is a block diagram of a circuit 50 comprising a sense amplifier-type latch 52 and a keeper circuit 54. In general, the sense amplifier-type latch 52 is a generic illustration of any one of the sense amplifier-type latches depicted in FIG. 2, 3 or 4. The latch 52 includes first and second input nodes DP and DN (differential input) and first and second output nodes QP and QN (differential output). The differential outputs QP and QN of the latch circuit 52 are connected to first and second inputs INP and INN of the keeper circuit 54. The keeper circuit 54 includes first and second output nodes OUTP and OUTN which output a buffered version (Output_P, Output_N) of the outputs (QP and QN) of the sense amplifier-type latch 52. In general, the keeper circuit 54 buffers a valid output QP-QN (decision) of the sense amplifier-type latch circuit 52 which is generated during an evaluation phase of the latch circuit 52. When the sense amplifier-type latch circuit 52 enters its precharge phase, and both of its outputs QP and QN are precharged to the same precharge level, the keeper circuit 54 holds its outputs Output_P and Output_N constant (representing the valid output QP-QN of the latch 52 from its previous data decision) until the next evaluation phase.

One standard circuit that can be used as a keeper circuit for a sense amplifier-type latch circuit is a Set-Reset (SR) latch. For instance, an SR latch with active low inputs can be connected to the QP and QN outputs of one of the sense amplifier-type latches depicted in FIG. 2, 3 or 4. When the sense amplifier-type latch makes a data decision (during the evaluation phase), one of its outputs becomes low, which either sets or resets the SR latch so that the output of the SR latch then matches the valid output of the sense amplifier-type latch. When one of the sense amplifier-type latches depicted in FIG. 2, 3 or 4 enters its precharge phase, both of its outputs QP and QN become high, so the SR latch maintains its current state until the next evaluation phase of the sense amplifier-type latch.

Figure 6:
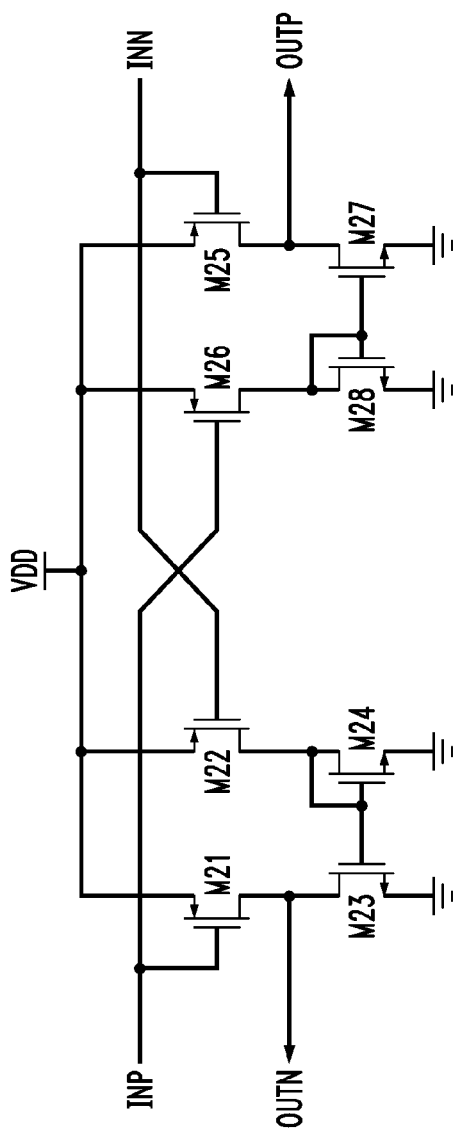
FIG. 6 is a schematic circuit diagram of a keeper circuit that may be implemented in the circuit of FIG. 5.

Very high-speed applications such as DFEs operating at data rates well above 10 Gb/s may require that the keeper circuit have a propagation delay that is shorter than that possible with an SR latch. FIG. 6 is a schematic circuit diagram of a keeper circuit that may be used to implement the circuit of FIG. 5 while achieving a propagation delay shorter than that of an SR latch. When a sense amplifier-type latch such as that depicted in FIG. 2, 3 or 4 generates a valid output (during its evaluation phase), one of the two inputs (INP, INN) of the keeper circuit becomes high, and the other becomes low. For instance, if the sense amplifier-type latch generates a logic 1 bit, INP becomes high, and INN becomes low. Because INP is high, PMOS transistor M26 is turned off, so no current flows into the current mirror formed by NMOS transistors M28 and M27. Since M27 is effectively shut off, it does not pull down the output node OUTP. On the other hand, PMOS transistor M25 is turned on since INN is low, so OUTP is raised to the positive power supply. The low value of INN also turns on PMOS transistor M22, which drives a large current into the current mirror formed by NMOS transistors M24 and M23. Therefore, M23 generates a large pull-down current while the high value of INP turns off PMOS transistor M21. As a result, OUTN is pulled down to ground. In a similar manner, if the sense amplifier-type latch generates a logic 0 bit, OUTP is pulled down to ground, and OUTN is raised to the positive power supply. The output of the keeper circuit of FIG. 6 thus matches the valid output of the sense amplifier-type latch.

When one of the sense amplifier-type latches depicted in FIG. 2, 3 or 4 enters its precharge phase, both inputs INP and INN of the keeper circuit of FIG. 6 become high, so PMOS transistors M21, M22, M25, and M26 are turned off. With M22 and M26 shut off, no currents flow in the two NMOS current mirrors (M23/M24 and M27/M28), so all of the NMOS transistors in the circuit of FIG. 6 are also shut off. With all of the NMOS and PMOS transistors shut off, and no current flowing in the circuit, the outputs OUTP and OUTN of the keeper circuit of FIG. 6 are held constant (representing the valid output of the sense amplifier-type latch from its previous data decision) by the parasitic capacitances at the output nodes. Due to leakage, this type of dynamic keeper circuit, in which the outputs are held constant not actively but with just capacitance, may not be suitable for lower-frequency applications (e.g., clock frequencies much lower than 1 GHz), but it works well in the very high frequency applications (e.g., clock frequencies well above 5 GHz) for which the sense amplifier-type latch of the present invention is intended.

Figure 7:
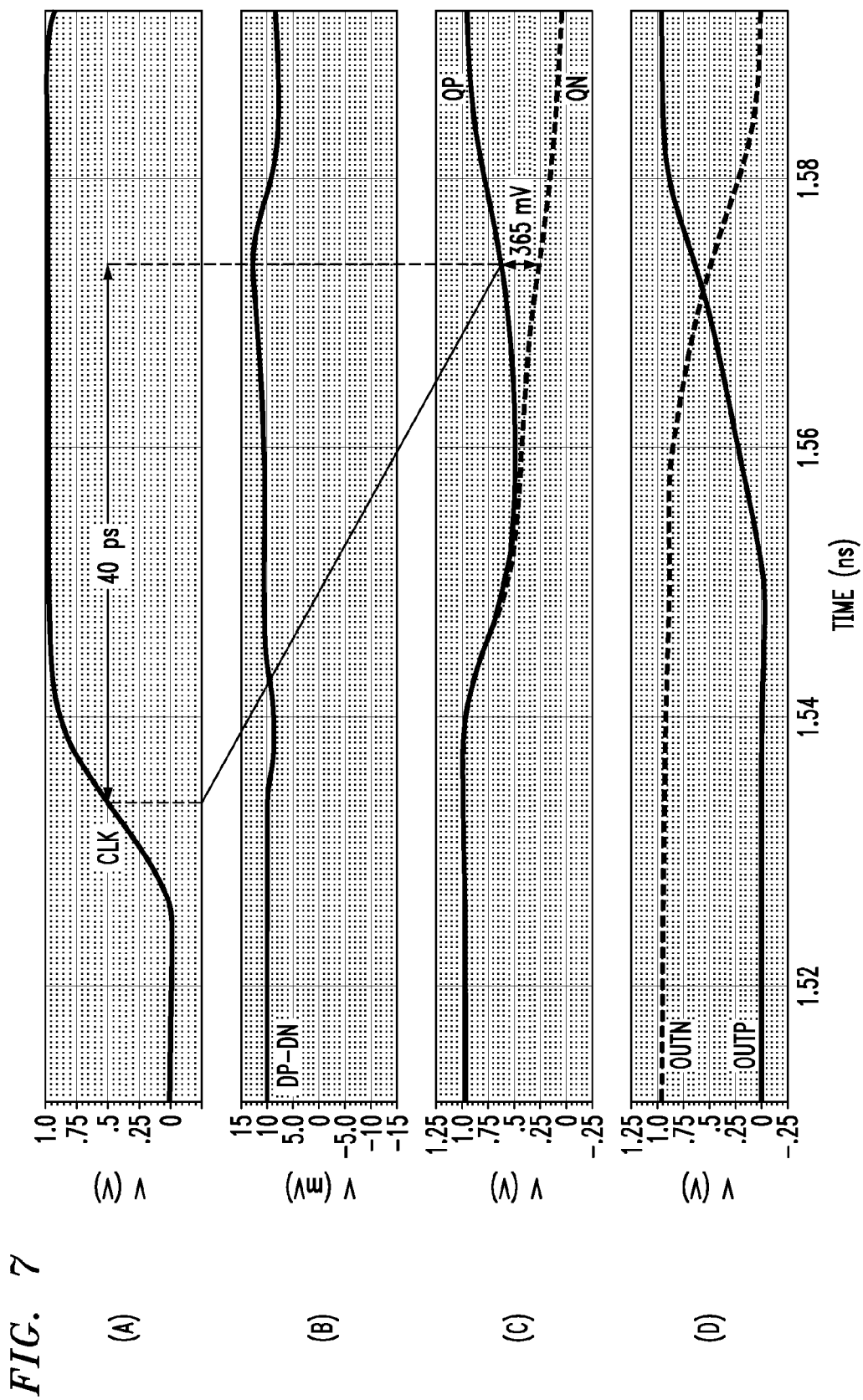
FIG. 7 depicts simulated waveforms that illustrate the performance achieved with the circuit of FIG. 5 implemented using the sense amplifier-type latch circuit of FIG. 2 and the keeper circuit of FIG. 6 at an operating clock frequency of 7.5 GHz.
Figure 8:
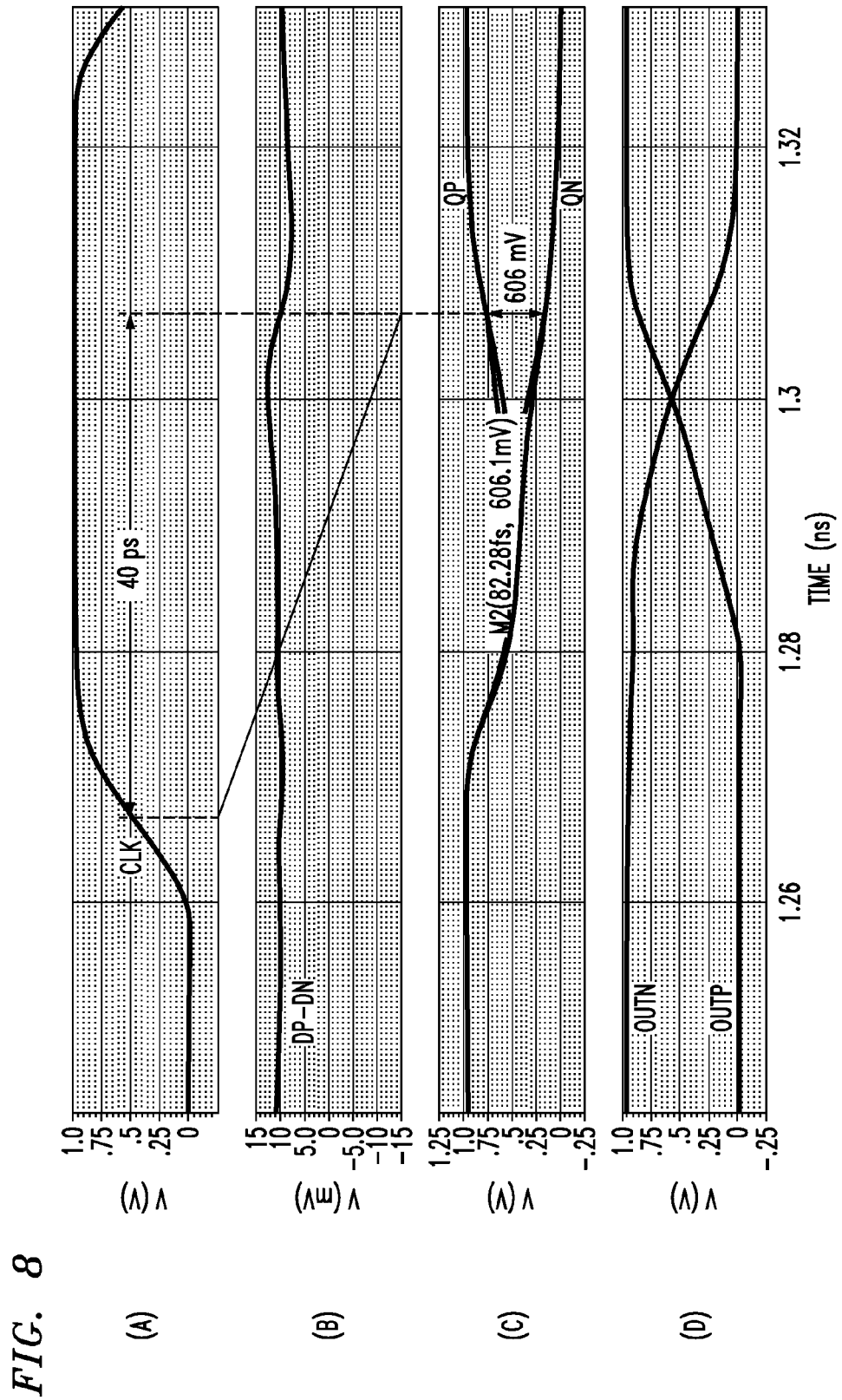
FIG. 8 depicts simulated waveforms that illustrate the performance achieved with the circuit of FIG. 5 implemented using the sense amplifier-type latch circuit of FIG. 3 and the keeper circuit of FIG. 6 at an operating clock frequency of 7.5 GHz, in accordance with the principles of the present invention.
Figure 9:
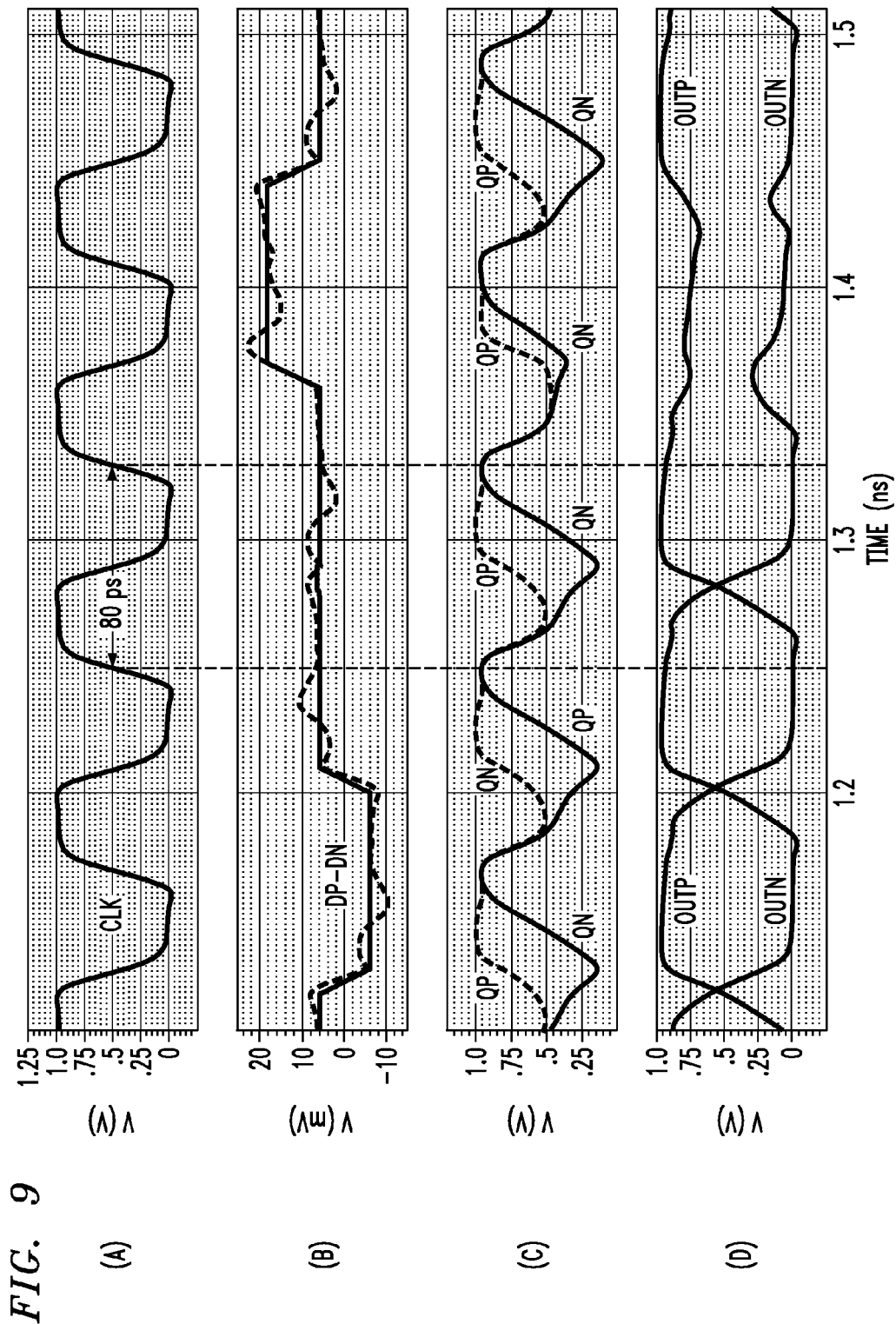
FIG. 9 depicts simulated waveforms that illustrate the performance achieved with the circuit of FIG. 5 implemented using the sense amplifier-type latch circuit of FIG. 3 and the keeper circuit of FIG. 6 at an operating clock frequency of 12.5 GHz, in accordance with the principles of the present invention.

In order to illustrate the improved response time that is achieved using sense amplifier-type latches according to principles of the invention, computer simulations were performed on the circuit of FIG. 5. The computer simulation results are shown in FIGS. 7, 8, and 9. In general, FIG. 7 depicts simulated waveforms that illustrate the performance achieved with the circuit of FIG. 5 implemented using the sense amplifier-type latch circuit of FIG. 2 and the keeper circuit of FIG. 6 at an operating clock frequency of 7.5 GHz. FIG. 8 depicts simulated waveforms that illustrate the performance achieved with the circuit of FIG. 5 implemented using the sense amplifier-type latch circuit of FIG. 3 and the keeper circuit of FIG. 6, at an operating clock frequency of 7.5 GHz, in accordance with the principles of the present invention. FIG. 9 depicts simulated waveforms that illustrate the performance achieved with the circuit of FIG. 5 implemented using the sense amplifier-type latch circuit of FIG. 3 and the keeper circuit of FIG. 6 at an operating clock frequency of 12.5 GHz, in accordance with the principles of the present invention.

In particular, FIG. 7 shows the simulated performance of the conventional sense amplifier-type latch circuit of FIG. 2 when implemented in 32 nm CMOS silicon-on-insulator (SOI) technology. In FIG. 7, waveform (a) depicts the clock signal CLK applied to the gates of transistors M1, M2, M5, M6, M11 and M12 in FIG. 2, waveform (b) shows the differential input DP-DN, waveform (c) shows the outputs of the sense amplifier-type latch at nodes QP and QN, and waveform (d) shows the outputs of the keeper circuit OUTN and OUTP.

Furthermore, FIG. 8 shows the simulated performance of the sense amplifier-type latch circuit of FIG. 3 when implemented in 32 nm CMOS SOI technology. In FIG. 8, waveform (a) depicts the clock signal CLK applied to the gates of transistors M2, M5 and M12 in FIG. 3, waveform (b) shows the differential input DP-DN, waveform (c) shows the outputs of the sense amplifier-type latch at nodes QP and QN, and waveform (d) shows the outputs of the keeper circuit OUTN and OUTP.

To ensure the functionality of the conventional sense amplifier-type latch of FIG. 2, the frequency of the clock signal CLK applied in the first two computer simulations (waveforms (a) in FIGS. 7 and 8) was set at 7.5 GHz. The differential input amplitude DP-DN (waveforms (b) in FIGS. 7 and 8) is 10 mV. The arrows in waveforms (c) of FIGS. 7 and 8 show how much differential output signal QP-QN is generated 40 ps into the evaluation phase (which would be all that is available if the clock frequency were raised to 12.5 GHz). Specifically, for the conventional sense amplifier-type latch, only 365 mV of differential output is generated after 40 ps (as shown in waveform (c) of FIG. 7). For the sense amplifier-type latch with static bias current, 606 mV of differential output is generated after 40 ps (waveform (c) of FIG. 8), which yields an improvement of almost 1.7×. This illustrates how reducing the turn-on time of the sense amplifier-type latch and allowing the regeneration to start earlier helps produce stronger signals to drive the keeper circuit, whose output then switches earlier (compare waveforms (d) in FIGS. 7 and 8).

The acceleration of the regenerative amplification allows the sense amplifier-type latch circuit of FIG. 3 to operate with high sensitivity at higher clock rates. As an example, FIG. 9 shows the simulated performance of the sense amplifier-type latch circuit of FIG. 3 when implemented in 32 nm CMOS SOI technology and operating at a clock frequency of 12.5 GHz. In FIG. 9, waveform (a) depicts the clock signal CLK applied to the gates of transistors M2, M5 and M12 in FIG. 3, waveform (b) shows the differential input DP-DN, waveform (c) shows the outputs of the sense amplifier-type latch at nodes QP and QN, and waveform (d) shows the outputs of the keeper circuit OUTN and OUTP. FIG. 9 shows proper operation at a clock frequency of 12.5 GHz, wherein high sensitivity of the latch is demonstrated by the differential input amplitude (waveform (b) in FIG. 9) being as small as 6 mV. Though the differential output signal QP-QN (waveform (c)) is relatively weak with the circuit operating close to its sensitivity limit, it still has sufficient amplitude to drive the keeper circuit to generate the correct output bit pattern (waveform (d)). Other simulations show that when the conventional sense amplifier-type latch of FIG. 2 is simulated at a clock frequency of 12.5 GHz with similar input amplitudes, the keeper circuit does not generate the correct output bit pattern.

Further aspects of the present invention provide sense amplifier-type latch circuits which can be utilized in integrated circuit chips with various analog and digital integrated circuitries. In particular, integrated circuit dies can be fabricated having sense amplifier-type latch circuits and other semiconductor devices such as field-effect transistors, bipolar transistors, metal-oxide-semiconductor transistors, diodes, resistors, capacitors, inductors, etc., forming analog and/or digital circuits. The sense amplifier-type latch circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:
1. A circuit, comprising:
   a sense amplifier-type latch circuit, comprising:
   differential input nodes and differential output nodes;
   a latch circuit comprising a first inverter and a second inverter, cross-couple connected to each other, wherein the latch circuit captures and stores data during an evaluation phase of the sense amplifier-type latch circuit, and outputs the stored data to the differential output nodes;
   a differential transistor pair having gates connected to the differential input nodes of the sense amplifier-type latch circuit, having drains connected to the latch circuit, and having sources commonly connected to a coupled source node;
   a static bias current circuit connected to the coupled source node of the differential transistor pair to provide a static bias current which flows through the differential transistor pair and the first and second inverters of the latch circuit during a precharge phase; and
   a switch device connected to the coupled source node, wherein the switch device is turned off during the precharge phase and turned on during the evaluation phase of the sense amplifier-type latch circuit by operation of a clock signal to increase current flow through the differential transistor pair; and
   a keeper circuit comprising first and second input terminals connected to the differential output nodes of the sense amplifier-type latch circuit, wherein the keeper circuit comprises first and second output nodes, wherein the keeper circuit holds a value of a previously decided bit resulting from a previous evaluation phase on the first and second output nodes during a given precharge phase that follows the previous evaluation phase of the sense amplifier-type latch circuit, the keeper circuit further comprising:
   a first amplifier having a first pair of input transistors, and a first current mirror, wherein gate terminals of the first pair of input transistors are connected to a respective one of the first and second input terminals, wherein the first pair of input transistors are directly connected between a power supply node and the first current mirror, and wherein an output of the first amplifier is connected to the first output node,
   a second amplifier having a second pair of input transistors, and a second current mirror, wherein gate terminals of the second pair of input transistors are connected to a respective one of the first and second input terminals, wherein the second pair of input transistors are directly connected between the power supply node and the second current mirror, and wherein an output of the second amplifier is connected to the second output node;
   wherein the first and second amplifiers produce outputs of opposite polarity; and
   wherein during a precharge phase of the sense amplifier-type latch circuit, the voltage outputs on the differential output nodes of the sense amplifier-type latch circuit cause the first and second pair of input transistors and the first and second current mirrors of the first and second amplifiers to turn off, while the keeper circuit holds a value of a previously decided bit resulting from a previous evaluation phase with a capacitance on the first output node and a capacitance on the second output node of the keeper circuit.

2. The circuit of claim 1, wherein the sense amplifier-type latch circuit further comprises;

a reset circuit comprising:
- a first reset switch connected between a first power supply node and a first output node of the differential output nodes,
- a second reset switch connected between the first power supply node and a second output node of the differential output nodes,
- wherein the first and second reset switches are responsive to the clock signal to switchably connect the first power supply voltage node to the first and second output nodes of the sense amplifier-type latch circuit during the precharge phase, and to switchably disconnect the first power supply voltage node from the first and second output nodes of the sense amplifier-type latch circuit during the evaluation phase.

3. The circuit of claim 1, wherein the static bias current circuit comprises:
- a source of bias current; and
- a current mirror connected to the source of bias current and the coupled source node of the differential transistor pair, wherein the current mirror generates the static bias current by mirroring a current generated by the source of bias current.

4. The circuit of claim 1, wherein the capacitances on the first and second output nodes of the keeper circuit comprise parasitic capacitances.

5. A circuit, comprising:
- a sense amplifier-type latch circuit, comprising:
  - a first input node, a second input node, a first output node, a second output node, a first power supply node, and a second power supply node;
  - a differential amplifier stage comprising first and second output nodes;
  - a latch circuit connected between the first power supply node and the first and second output nodes of the differential amplifier stage, wherein the latch circuit comprises first and second inverters, which are cross-coupled to each other, wherein an output of the first inverter is connected to the first output node of the sense amplifier-type latch circuit and to an input of the second inverter, and wherein an output of the second inverter is connected to the second output node of the sense amplifier-type latch circuit and to an input of the first inverter;
  - wherein the differential amplifier stage further comprises:
    - a differential transistor pair having gates connected to the first and second input nodes of the sense amplifier-type latch circuit, the differential transistor pair having a coupled source node;
    - a switch device connected between the coupled source node and the second power supply node, wherein the switch device is turned off during a precharge phase and turned on during an evaluation phase of the sense amplifier-type latch circuit by operation of a clock signal; and
    - a static bias current circuit connected to the coupled source node of the differential transistor pair to provide a static bias current which flows through the differential amplifier stage and the first and second inverters of the latch circuit during the precharge phase; and
  - a reset circuit comprising a first reset switch connected between the first power supply node and the first output node of the sense amplifier-type latch circuit, and a second reset switch connected between the first power supply node and the second output node of the sense amplifier-type latch circuit, wherein the first and second reset switches are responsive to the clock signal to switchably connect the first power supply voltage node to the first and second output nodes of the sense amplifier-type latch circuit during the precharge phase, and to switchably disconnect the first power supply voltage node from the first and second output nodes of the sense amplifier-type latch circuit during the evaluation phase; and
- a keeper circuit comprising first and second input terminals connected to the first and second output nodes of the sense amplifier-type latch circuit, wherein the keeper circuit comprises first and second output nodes, wherein the keeper circuit holds a value of a previously decided bit resulting from a previous evaluation phase on the first and second output nodes of the keeper circuit during a given recharge phase that follows the previous evaluation phase of the sense amplifier-type latch circuit, the keeper circuit further comprising:
  - a first amplifier having a first pair of input transistors, and a first current mirror, wherein gate terminals of the first pair of input transistors are connected to a respective one of the first and second input terminals, wherein the first pair of input transistors are directly connected between the first power supply node and the first current mirror, and wherein an output of the first amplifier is connected to the first output node of the keeper circuit;
  - a second amplifier having a second pair of input transistors, and a second current mirror, wherein gate terminals of the second pair of input transistors are connected to a respective one of the first and second input terminals, wherein the second pair of input transistors are directly connected between the first power supply node and the second current mirror, and wherein an output of the second amplifier is connected to the second output node of the keeper circuit;
  - wherein the first and second amplifiers produce outputs of opposite polarity; and
  - wherein during a precharge phase of the sense amplifier-type latch circuit, the voltage outputs on the first and second output nodes of the sense amplifier-type latch circuit cause the first and second pair of input transistors and the first and second current mirrors of the first and second amplifiers to turn off, while the keeper circuit holds a value of a previously decided bit resulting from a previous evaluation phase with a capacitance on the first output node and a capacitance on the second output node of the keeper circuit.

6. The circuit of claim 5, wherein the static bias current circuit comprises:
- a source of bias current; and
- a current mirror connected to the source of bias current and the coupled source node of the differential transistor pair, wherein the current mirror generates the static bias current by mirroring a current generated by the source of bias current.

7. The circuit of claim 5, wherein the capacitances on the first and second output nodes of the keeper circuit comprise parasitic capacitances.

8. A semiconductor integrated circuit chip comprising an integrated circuit, the integrated circuit comprising:
- a sense amplifier-type latch circuit; and
- a keeper circuit;
- wherein the sense amplifier-type latch circuit comprises:
  - a first input node, a second input node, a first output node, a second output node, a first power supply node, and a second power supply node;

a differential amplifier stage comprising first and second output nodes;
a latch circuit connected between the first power supply node and the first and second output nodes of the differential amplifier stage, wherein the latch circuit comprises first and second inverters, which are cross-coupled to each other, wherein an output of the first inverter is connected to the first output node of the sense amplifier-type latch circuit and to an input of the second inverter, and wherein an output of the second inverter is connected to the second output node of the sense amplifier-type latch circuit and to an input of the first inverter;
wherein the differential amplifier stage further comprises:
a differential transistor pair having gates connected to the first and second input nodes of the sense amplifier-type latch circuit, the differential transistor pair having a coupled source node;
a switch device connected between the coupled source node and the second power supply node, wherein the switch device is turned off during a precharge phase and turned on during an evaluation phase of the sense amplifier-type latch circuit by operation of a clock signal; and
a static bias current circuit connected to the coupled source node of the differential transistor pair to provide a static bias current which flows through the differential amplifier stage and the first and second inverters of the latch circuit during the precharge phase; and
a reset circuit comprising a first reset switch connected between the first power supply node and the first output node of the sense amplifier-type latch circuit, and a second reset switch connected between the first power supply node and the second output node of the sense amplifier-type latch circuit, wherein the first and second reset switches are responsive to the clock signal to switchably connect the first power supply voltage node to the first and second output nodes of the sense amplifier-type latch circuit during the precharge phase, and to switchably disconnect the first power supply voltage node from the first and second output nodes of the sense amplifier-type latch circuit during the evaluation phase;
wherein the keeper circuit comprises first and second input terminals connected to the first and second output nodes of the sense amplifier-type latch circuit, wherein the keeper circuit comprises first and second output nodes, wherein the keeper circuit holds a value of a previously decided bit resulting from a previous evaluation phase on the first and second output nodes of the keeper circuit during a given precharge phase that follows the previous evaluation phase of the sense amplifier-type latch circuit, the keeper circuit further comprising:
a first amplifier having a first pair of input transistors, and a first current mirror, wherein gate terminals of the first pair of input transistors are connected to a respective one of the first and second input terminals, wherein the first pair of input transistors are directly connected between the first power supply node and the first current mirror, and wherein an output of the first amplifier is connected to the first output node of the keeper circuit;
a second amplifier having a second pair of input transistors, and a second current mirror, wherein gate terminals of the second pair of input transistors are connected to a respective one of the first and second input terminals, wherein the second pair of input transistors are directly connected between the first power supply node and the second current mirror, and wherein an output of the second amplifier is connected to the second output node of the keeper circuit;
wherein the first and second amplifiers produce outputs of opposite polarity; and
wherein during a precharge phase of the sense amplifier-type latch circuit, the voltage outputs on the first and second output nodes of the sense amplifier-type latch circuit cause the first and second pair of input transistors and the first and second current mirrors of the first and second amplifiers to turn off, while the keeper circuit holds a value of a previously decided bit resulting from a previous evaluation phase with a capacitance on the first output node and a capacitance on the second output node of the keeper circuit.

9. The semiconductor integrated circuit chip of claim 8, wherein the static bias current circuit comprises:
a source of bias current; and
a current mirror connected to the source of bias current and the coupled source node of the differential transistor pair, wherein the current mirror generates the static bias current by mirroring a current generated by the source of bias current.

10. The semiconductor integrated circuit chip of claim 8, wherein the capacitances on the first and second output nodes of the keeper circuit comprise parasitic capacitances.

* * * * *